(12) United States Patent
Ohsawa et al.

(10) Patent No.: US 7,335,458 B2
(45) Date of Patent: *Feb. 26, 2008

(54) CHEMICALLY AMPLIFIED POSITIVE RESIST COMPOSITION AND PATTERNING PROCESS

(75) Inventors: Youichi Ohsawa, Joetsu (JP); Kazunori Maeda, Joetsu (JP); Satoshi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 71 days.

This patent is subject to a terminal disclaimer.

(21) Appl. No.: 11/354,204

(22) Filed: Feb. 15, 2006

(65) Prior Publication Data

US 2006/0188810 A1    Aug. 24, 2006

(30) Foreign Application Priority Data

Feb. 18, 2005   (JP)   ............................. 2005-041587

(51) Int. Cl.
  G03F 7/004   (2006.01)
  G03F 7/30    (2006.01)

(52) U.S. Cl. .................. 430/270.1; 430/326; 430/330; 430/905; 430/910

(58) Field of Classification Search ............ 430/270.1, 430/905, 910, 326, 330

See application file for complete search history.

(56) References Cited

U.S. PATENT DOCUMENTS

| 6,004,724 | A | 12/1999 | Yamato et al. | |
| 6,261,738 | B1 | 7/2001 | Asakura et al. | |
| 6,492,091 | B2 * | 12/2002 | Kodama et al. | 430/270.1 |
| 6,841,334 | B2 * | 1/2005 | Yagihashi et al. | 430/270.1 |

FOREIGN PATENT DOCUMENTS

| JP | 5-181279 | 7/1993 |
| JP | 5-222257 | 8/1993 |
| JP | 8-123032 | 5/1996 |
| JP | 9-95479 | 4/1997 |
| JP | 9-208554 | 8/1997 |
| JP | 9-230588 | 9/1997 |
| JP | 9-301948 | 11/1997 |
| JP | 9-323970 | 12/1997 |
| JP | 10-90882 | 4/1998 |
| JP | 11-72921 | 3/1999 |
| JP | 2906999 | 4/1999 |
| JP | 11-190904 | 7/1999 |
| JP | 2000-047387 | 2/2000 |
| JP | 2000-181054 | 6/2000 |
| JP | 2000-314956 | 11/2000 |
| JP | 2000-344836 | 12/2000 |
| JP | 2001-233842 | 8/2001 |
| JP | 2002-202610 | 7/2002 |
| JP | 2003-084440 | 3/2003 |
| JP | 2004-115630 | 4/2004 |
| JP | 2004-347736 | 12/2004 |
| JP | 2004-347738 | 12/2004 |
| WO | WO 2004/074242 | 9/2004 |

OTHER PUBLICATIONS

Koji Arimitsu et al.; "Sensitivity Enhancement of Chemical-Amplification-Type Photoimaging Materials by Acetoacetic Acid Derivatives", Journal of Photopolymer Science and Technology, Technical Association of Photopolymers, vol. 8, No. 1, pp. 43-44, 1995.

Kazuaki Kudo et al.; "Enhancement of the Senesitivity of Chemical-Amplification-Type Photoimaging Materials by β-Tosyloxyketone Acetals", Journal of Photopolymer Science and Technology, Technical Association of Photopolymers, vol. 8, No. 1, pp. 45-46, 1995.

Koji Arimitsu et al.; "Effect of Phenolic Hydroxyl Residues on the Improvement of Acid-Proliferation-Type Photoimaging Materials", Journal of Photopolymer Science and Technology, Technical Association of Photopolymers, vol. 9, No. 1, pp. 29-30, 1996.

* cited by examiner

Primary Examiner—John S. Chu
(74) Attorney, Agent, or Firm—Westerman, Hattori, Daniels & Adrian, LLP.

(57) ABSTRACT

A chemically amplified positive resist composition is provided comprising (A) a resin containing acid labile groups other than acetal type which changes its solubility in an alkaline developer as a result of the acid labile groups being eliminated under the action of acid and (B) specific sulfonium salts as a photoacid generator.

The composition is improved in resolution and focus latitude, minimized in line width variation and profile degradation even on prolonged PED, improved in pattern profile after development, minimized in pattern feature size variation within the wafer plane by uneven development and thus best suited in the deep-UV lithography.

10 Claims, No Drawings

CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2005-041587 filed in Japan on Feb. 18, 2005, the entire contents of which are hereby incorporated by reference.

TECHNICAL FIELD

This invention relates to chemically amplified positive resist compositions which are sensitive to such radiation as UV, deep UV, electron beam, x-rays, excimer laser beams, γ-rays, and synchrotron radiation and suitable for the microfabrication of integrated circuits; and a patterning process using the same.

BACKGROUND ART

While a number of efforts are currently being made to achieve a finer pattern rule in the drive for higher integration and operating speeds in LSI devices, deep-ultraviolet lithography is thought to hold particular promise as the next generation in microfabrication technology.

One technology that has attracted a good deal of attention recently utilizes as the deep UV light source a high-intensity KrF excimer laser, especially an ArF excimer laser featuring a shorter wavelength. There is a desire to have a microfabrication technique of finer definition by combining exposure light of shorter wavelength with a resist material having a higher resolution.

In this regard, the recently developed, acid-catalyzed, chemical amplification type resist materials are expected to comply with the deep UV lithography because of their many advantages including high sensitivity, resolution and dry etching resistance. The chemical amplification type resist materials include positive working materials that leave the unexposed areas with the exposed areas removed and negative working materials that leave the exposed areas with the unexposed areas removed.

In chemically amplified, positive working, resist compositions to be developed with alkaline developers, an alkalisoluble phenol or a resin and/or compound in which carboxylic acid is partially or entirely protected with acid-labile protective groups (acid labile groups) is catalytically decomposed by an acid which is generated upon exposure, to thereby generate the phenol or carboxylic acid in the exposed area which is removed by an alkaline developer. Also, in similar negative working resist compositions, an alkali-soluble phenol or a resin and/or compound having carboxylic acid and a compound (acid crosslinking agent) capable of bonding or crosslinking the resin or compound under the action of an acid are crosslinked with an acid which is generated upon exposure whereby the exposed area is converted to be insoluble in an alkaline developer and the unexposed area is removed by the alkaline developer.

On use of the chemically amplified, positive working, resist compositions, a resist film is formed by dissolving a resin having acid labile groups as a binder and a compound capable of generating an acid upon exposure to radiation (to be referred to as photoacid generator) in a solvent, applying the resist solution onto a substrate by a variety of methods, and evaporating off the solvent optionally by heating. The resist film is then exposed to radiation, for example, deep UV through a mask of a predetermined pattern. This is optionally followed by post-exposure baking (PEB) for promoting acid-catalyzed reaction. The exposed resist film is developed with an aqueous alkaline developer for removing the exposed area of the resist film, obtaining a positive pattern profile. The substrate is then etched by any desired technique. Finally the remaining resist film is removed by dissolution in a remover solution or ashing, leaving the substrate having the desired pattern profile.

The chemically amplified positive resist compositions adapted for KrF excimer lasers generally use phenolic resins, for example, polyhydroxystyrene in which some or all of the hydrogen atoms of phenolic hydroxyl groups are protected with acid labile protective groups. Typical photoacid generator used therein are iodonium salts, sulfonium salts, bissulfonyldiazomethane compounds, N-sulfonyloxyimide compounds, and O-arylsulfonyloxime compounds. If necessary, there are added additives, for example, a dissolution inhibiting or promoting compound in the form of a carboxylic acid and/or phenol derivative having a molecular weight of up to 3,000 in which some or all of the hydrogen atoms of carboxylic acid and/or phenolic hydroxyl groups are protected with acid labile groups, a carboxylic acid compound for improving dissolution characteristics, a basic compound for improving contrast, and a surfactant for improving coating characteristics.

A variety of phenolic resins have been developed. For improving mask linearity by restraining solubility in developer, or for imparting etch resistance following pattern formation, the recent development work deals with polymers having styrene and indene monomers copolymerized as disclosed in JP-A 8-123032, JP-A 2002-202610, JP-A 2003-84440, and JP-A 2004-115630.

A variety of photoacid generators have been developed as well. As regards the sulfonium salt, a wide variety of compounds can be developed by changing a combination of cation and anion. In particular, active research works are made on triaryl sulfonium salts because they are thermally stable and less prone to decomposition reaction by basic compounds which are added for improving the resolution of resist. As long as the present inventors have empirically found, the use of a photoacid generator which generates 2,4,6-triisopropylbenzenesulfonic acid having a bulky sulfonic acid anion is characterized by low diffusion, and the use of a photoacid generator which generates nonafluoro-1-butanesulfonic acid with strong acidity is characterized by formation of a pattern with a high resolution. As regards the photoacid generators capable of generating these sulfonic acids, the photoacid generators having 2,4,6-triisopropylbenzenesulfonate are described in JP-A 5-222257 and JP-A 10-90882, and the photoacid generators which generate nonafluoro-1-butanesulfonic acid are described in the former, JP-A 5-222257.

Studies have also been made on the sulfonium cations of the foregoing sulfonium salts. Typical attempts include the use of a photoacid generator in the form of a triarylsulfonium salt having an acid labile group substituted thereon that enables to attain a dissolution contrast in liquid developer before and after exposure, achieving a pattern profile with a higher resolution, and the introduction of a simple substituent group such as alkyl that enhances the solubility of a sulfonium salt in resist solution for providing storage stability to the resist solution comprising a specific polymer (controlling particles in liquid) as described in JP-A 9-323970, JP-A 2000-47387, and JP-A 2000-181054.

For resist materials, it is well known to combine a plurality of photoacid generators. Typical combinations include a combination of photoacid generators which generate strong and weak acids as described in JP-A 5-181279; a combination of photoacid generators which generate a fluoro-substituted alkylsulfonic acid such as trifluoromethanesulfonic acid and a non-fluoro-substituted alkylsulfonic acid as described in JP-A 8-123032; and a combination of a compound which generates a sulfonic acid having at least three fluorine atoms upon exposure to radiation with a compound which generates a fluorine-free sulfonic acid upon exposure to radiation as described in JP-A 11-72921. The inclusion of a radiation-sensitive photoacid generator based on such a combination eliminates or minimizes nano-order edge roughness or film surface roughness and improves resolution.

However, as the pattern feature size required becomes finer, even the single or combined use of these photoacid generators gives rise to several problems including low resolution, defective configuration of pattern profile due to standing waves and resist film slimming during development, instability to the ambient environment, and uneven development which causes variations in pattern feature size within the wafer plane.

The phenomenon of uneven development is discussed in detail. When a resist is coated on a wafer, exposed, baked (PEB), and developed with an alkaline developer, the time and amount of contact with the developer within the wafer plane vary with the shape of a feed nozzle and the feed method of the developer. This difference in contact with the developer can introduce a difference in pattern profile feature size although the difference introduced is of an extremely minor quantity. Specifically, where more contact with the developer is available, the resist film becomes more dissolved, resulting in a narrower pattern line width. As the pattern feature size is miniaturized, this feature size variation due to uneven development is expanded to a noticeable extent. The site subject to such a phenomenon changes with the shape of the developer feed nozzle. As the general tendency, the line width becomes narrower at the wafer center and thicker at the wafer edge.

Also, the miniaturization of the pattern feature size entails a propensity of reducing the thickness of resist film used. This gives rise to the problem that when conventional phenolic resins having acid labile groups of acetal type are used, the pattern profile becomes rounded at the top, or a satisfactory pattern profile is not obtained.

DISCLOSURE OF THE INVENTION

While chemically amplified positive resist compositions are required to have the advantages including good storage stability, non-toxicity, effective coating, better pattern profile, PED stability, high sensitivity and resolution, wider depth of focus, and elimination of pattern feature size variation within the wafer plane due to uneven development, all these requirements are not fulfilled by those compositions comprising conventional resins and photoacid generators.

The current technical trend toward further miniaturizing of the integrated circuit pattern imposes severer requirements with respect to resolution, depth of focus, and uneven development.

An object of the present invention is to provide a chemically amplified positive resist composition which has solved the aforementioned problems, and is improved especially in pattern profile and depth of focus and minimized in pattern feature size variation during development; and a patterning process using the same.

The inventors have found that a chemically amplified positive resist composition comprising a resin free of acid labile groups of the acetal type which changes its solubility in an alkaline developer under the action of acid, a sulfonium salt of the formula (1a), and a sulfonium salt of the formula (1b) has solved the aforementioned problems, and is improved especially in pattern profile and depth of focus and minimized in pattern feature size variation during development, and that the composition is very effective when processed by the deep-UV lithography.

In particular, chemically amplified positive resist compositions comprising resins including recurring units of the formula (2a), (2a') or (2a"), and having groups of the formulae (3) to (5), tertiary alkyl groups of 4 to 20 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms as the acid labile groups, are more effective in solving the aforementioned problems, and improved especially in pattern profile and depth of focus and minimized in pattern feature size variation during development. These compositions are best suited when processed by the deep-UV lithography.

In one aspect, the invention provides a chemically amplified positive resist composition comprising (A) a resin containing acid labile groups other than acetal type which changes its solubility in an alkaline developer as a result of the acid labile groups being eliminated under the action of acid, and (B) sulfonium salts of the following formulae (1a) and (1b).

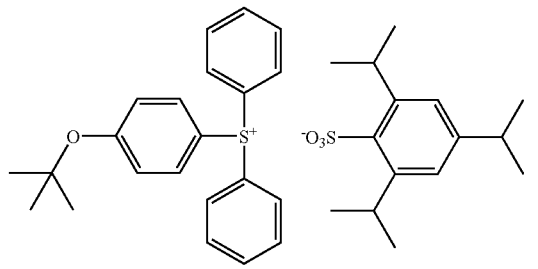

(1a)

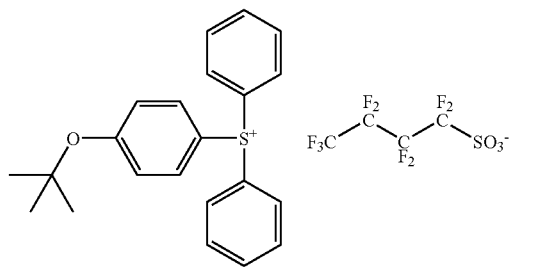

(1b)

In a preferred embodiment, the resin (A) is a polymer comprising recurring units having the general formula (2a) and having a weight average molecular weight of 3,000 to 100,000. The recurring units include partially substituted units wherein some of hydrogen atoms of the phenolic hydroxyl groups are replaced by acid labile groups of at least one type, the acid labile group-containing units are included in a proportion of more than 0 mol % to 80 mol %, on the average, of the entire polymer.

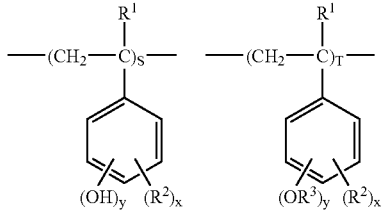
(2a)

Herein $R^1$ is hydrogen or methyl, $R^2$ is a straight, branched or cyclic alkyl group of 1 to 8 carbon atoms, x is 0 or a positive integer, y is a positive integer, satisfying $x+y \leq 5$, $R^3$ is an acid labile group other than acetal type, S and T are positive integers, satisfying $0<T/(S+T) \leq 0.8$.

In another preferred embodiment, the resin (A) is a polymer comprising recurring units having the general formula (2a') and having a weight average molecular weight of 3,000 to 100,000. The recurring units include units derived from acrylate or methacrylate in a proportion of more than 0 mol % to 50 mol %, on the average, of the entire polymer and acid labile group-containing units in a proportion of more than 0 mol % to 80 mol %, on the average, of the entire polymer.

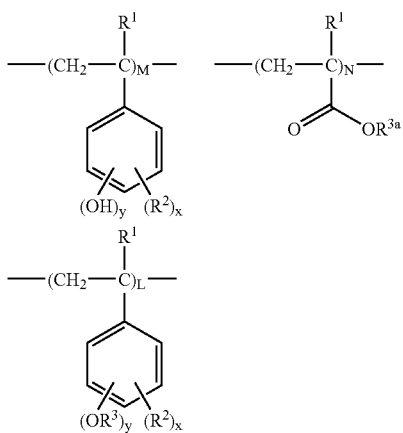
(2a')

Herein $R^1$ is hydrogen or methyl, $R^2$ is a straight, branched or cyclic alkyl group of 1 to 8 carbon atoms, $R^3$ is an acid labile group other than acetal type, R is hydrogen or an acid labile group other than acetal type, at least some of $R^{3a}$ being acid labile groups other than acetal type, x is 0 or a positive integer, y is a positive integer, satisfying $x+y \leq 5$, M and N are positive integers, L is 0 or a positive integer, satisfying $0<N/(M+N+L) \leq 0.5$ and $0<(N+L)/(M+N+L) \leq 0.8$.

In a further preferred embodiment, the resin (A) is a polymer comprising recurring units having the general formula (2a'') and having a weight average molecular weight of 3,000 to 100,000. The recurring units include units derived from indene and/or substituted indene in a proportion of more than 0 mol % to 50 mol %, on the average, of the entire polymer and acid labile group-containing units in a proportion of more than 0 mol % to 80 mol %, on the average, of the entire polymer.

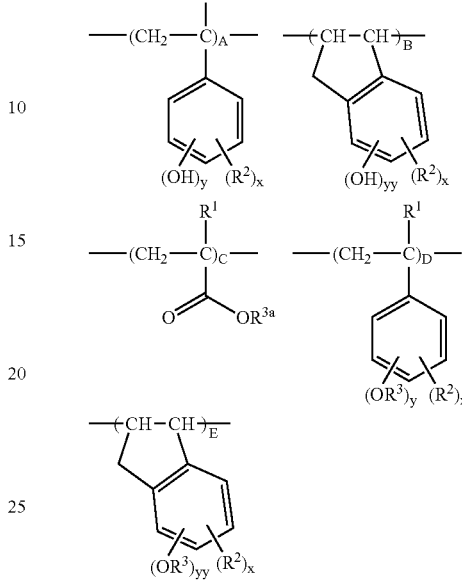
(2a'')

Herein $R^1$ is hydrogen or methyl, $R^2$ is a straight, branched or cyclic alkyl group of 1 to 8 carbon atoms, $R^3$ is an acid labile group other than acetal type, $R^{3a}$ is hydrogen or an acid labile group other than acetal type, at least some of $R^3$a being acid labile groups other than acetal type, x is 0 or a positive integer, y is a positive integer, satisfying $x+y \leq 5$, yy is 0 or a positive integer, satisfying $x+yy \leq 4$, A and B are positive integers, C, D and E each are 0 or a positive integer, satisfying $0<(B+E)/(A+B+C+D+E) \leq 0.5$ and $0<(C+D+E)/(A+B+C+D+E) \leq 0.8$.

In these preferred embodiments, the acid labile group is typically selected from the group consisting of groups of the following general formulae (3) to (5), tertiary alkyl groups of 4 to 20 carbon atoms, trialkylsilyl groups whose alkyl groups each have 1 to 6 carbon atoms, oxoalkyl groups of 4 to 20 carbon atoms, and aryl-substituted alkyl groups of 7 to 20 carbon atoms.

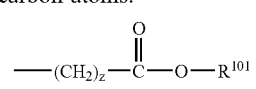
(3)

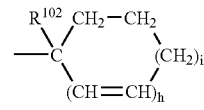
(4)

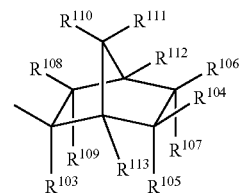
(5)

Herein $R^{101}$ is a tertiary alkyl group of 4 to 20 carbon atoms, trialkylsilyl group whose alkyl groups each have 1 to 6 carbon atoms, oxoalkyl group of 4 to 20 carbon atoms or a group of formula (4), z is an integer of 0 to 6, $R^{102}$ is a straight, branched or cyclic alkyl group of 1 to 8 carbon atoms or substituted or unsubstituted aryl group of 6 to 20 carbon atoms, h is 0 or 1, i is 0, 1, 2 or 3, satisfying 2h+i=2 or 3, $R^{103}$ is a straight, branched or cyclic alkyl group of 1 to 8 carbon atoms or substituted or unsubstituted aryl group of 6 to 20 carbon atoms, $R^{104}$ to $R^{113}$ are each independently hydrogen or a monovalent hydrocarbon group of 1 to 15 carbon atoms which may contain a hetero atom, or $R^{104}$ to $R^{113}$, taken together, may form a ring, with the proviso that they are divalent hydrocarbon groups of 1 to 15 carbon atoms which may contain a hetero atom when they form a ring, or two of $R^{104}$ to $R^{113}$ which are attached to adjacent carbon atoms may directly bond together to form a double bond.

In other preferred embodiments, the resist composition may further comprise (C) a compound capable of generating an acid upon exposure to radiation, other than component (B), (D) a basic compound, (E) an organic acid derivative, and (F) a solvent which is typically a propylene glycol alkyl ether acetate, an alkyl lactate or a mixture thereof.

In another aspect, the invention provides a process for forming a pattern, comprising the steps of (i) applying the resist composition defined above onto a substrate to form a coating, (ii) heat treating the coating and exposing the coating to high energy radiation with a wavelength of up to 300 nm or electron beam through a photomask, (iii) optionally heat treating the exposed coating, and developing the coating with a developer.

BENEFITS OF THE INVENTION

Since a resin which is free of acid labile groups of acetal type and changes its solubility in an alkaline developer under the action of acid is combined with 4-(tert-butoxyphenyl)diphenylsulfonium 2,4,6-triisopropylbenzenesulfonate and 4-(tert-butoxyphenyl)diphenylsulfonium nonafluoro-1-butanesulfonate as a photoacid generator, the chemically amplified positive resist composition of the present invention is improved in resolution and focus latitude, minimized in line width variation and profile degradation even on prolonged PED, improved in pattern profile after development, high in resolution enough for micropatterning, and minimized in pattern feature size variation within the wafer plane by uneven development. These advantages become prominent in processing by the deep-UV lithography.

DESCRIPTION OF THE PREFERRED EMBODIMENTS

Component A

In the chemically amplified positive resist composition of the present invention, component (A) is a resin which is free of acid labile groups of acetal type and changes its solubility in an alkaline developer under the action of acid.

Although the resin which is free of acid labile groups of acetal type and changes its solubility in an alkaline developer under the action of acid is not particularly limited, preferred are alkali-soluble polymers (or high molecular weight compounds) having phenolic hydroxyl groups and/or carboxyl groups, some or all of which are protected with protective groups other than acetal type which have a C—O—C linkage and are labile to acid.

The alkali-soluble polymers having phenolic hydroxyl groups and/or carboxyl groups include homopolymers and copolymers of p-hydroxystyrene, m-hydroxystyrene, α-methyl-p-hydroxystyrene, 4-hydroxy-2-methylstyrene, 4-hydroxy-3-methylstyrene, hydroxyindene, methacrylic acid and acrylic acid, and modified forms of these polymers in which carboxylic acid derivatives, diphenyl ethylene or the like are incorporated at ends.

Also included are copolymers in which additional units free of alkali-soluble sites such as styrene, α-methylstyrene, acrylates, methacrylates, hydrogenated hydroxystyrene, maleic anhydride, maleimide, substituted or unsubstituted indene, or the like are introduced in addition to the aforementioned units in such a proportion as not to incur an extreme decline of solubility in alkaline developer. The acrylates and methacrylates may have any substituent groups as long as such groups are not labile to acid. Exemplary substituent groups are straight, branched or cyclic $C_1$-$C_8$ alkyl groups and aromatic groups such as aryl though not limited thereto.

Examples of the alkali-soluble polymers include, but are not limited to, poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-indene copolymers, p-hydroxystyrene-acrylic acid copolymers, p-hydroxystyrene-methacrylic acid copolymers, p-hydroxystyrene-methyl acrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, polymethacrylic acid, polyacrylic acid, acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers.

Of these, poly(p-hydroxystyrene), partially hydrogenated p-hydroxystyrene copolymers, p-hydroxystyrene-styrene copolymers, p-hydroxystyrene-indene copolymers, p-hydroxystyrene-acrylic acid copolymers, and p-hydroxystyrene-methacrylic acid copolymers are preferred.

More preferred are alkali-soluble polymers comprising recurring units of the formula (2) or (2') or (2") shown below.

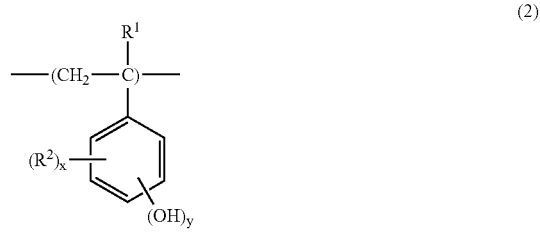

-continued

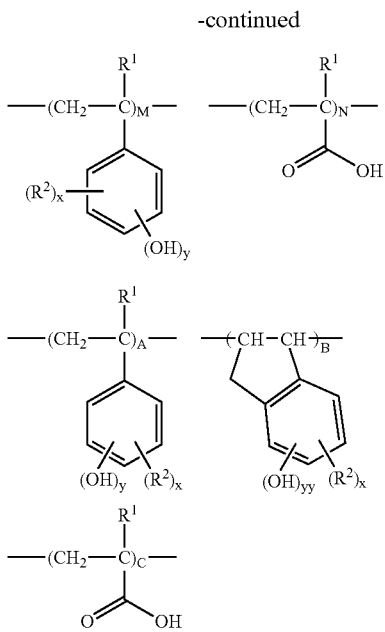

Herein $R^1$ is hydrogen or methyl, $R^2$ is a straight, branched or cyclic alkyl group of 1 to 8 carbon atoms; x is 0 or a positive integer, y is a positive integer, satisfying $x+y \leq 5$; M and N are positive integers, satisfying $0 < N/(M+N) \leq 0.5$; yy is 0 or a positive integer, satisfying $x+yy \leq 4$, A and B are positive integers, C is 0 or a positive integer, satisfying $0 < B/(A+B+C) \leq 0.5$.

The polymer of formula (2″) can be synthesized, for example, by effecting thermal polymerization of an acetoxystyrene monomer, a tertiary alkyl (meth)acrylate monomer and an indene monomer in an organic solvent in the presence of a radical initiator, and subjecting the resulting polymer to alkaline hydrolysis in an organic solvent for deblocking the acetoxy group, for thereby forming a ternary copolymer of hydroxystyrene, tertiary alkyl (meth)acrylate and indene. The organic solvent used during polymerization is exemplified by toluene, benzene, tetrahydrofuran, diethyl ether and dioxane. Exemplary polymerization initiators include 2,2′-azobisisobutyronitrile, 2,2′-azobis(2,4-dimethylvaleronitrile), dimethyl-2,2-azobis(2-methylpropionate), benzoyl peroxide, and lauroyl peroxide. Polymerization is preferably effected while heating at 50 to 80° C. The reaction time is usually about 2 to 100 hours, preferably about 5 to 20 hours. Aqueous ammonia, triethylamine or the like may be used as the base for the alkaline hydrolysis. For the alkaline hydrolysis, the temperature is usually −20° C. to 100° C., preferably 0° C. to 60° C., and the time is about 0.2 to 100 hours, preferably about 0.5 to 20 hours.

Also included are polymers having the dendritic or hyperbranched polymer structure of formula (2‴) below.

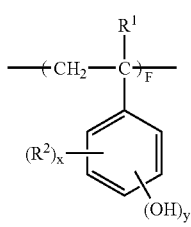

(2‴)

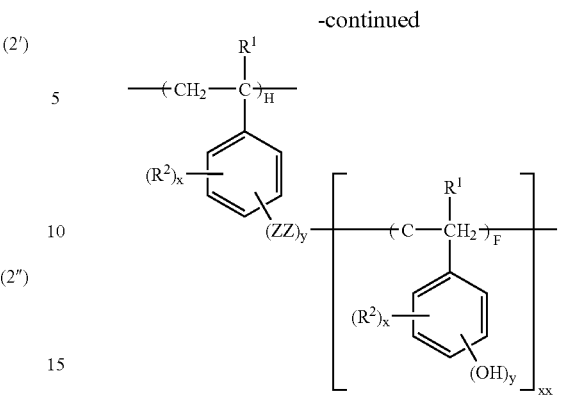

Herein ZZ is a divalent organic group selected from among $CH_2$, $CH(OH)$, $CR^2(OH)$, $C=O$ and $C(OR^2)(OH)$ or a trivalent organic group represented by $-C(OH)=$. Subscript F, which may be identical or different, is a positive integer, and H is a positive integer, satisfying $0.001 \leq H/(H+F) \leq 0.1$, and XX is 1 or 2. $R^1$, $R^2$, x and y are as defined above.

The dendritic or hyperbranched polymer of phenol derivative can be synthesized by effecting living anion polymerization of a polymerizable monomer such as 4-tert-butoxystyrene and reacting a branching monomer such as chloromethylstyrene as appropriate during the living anion polymerization.

More particularly, living anion polymerization is started using a polymerizable monomer such as 4-tert-butoxystyrene. After a predetermined amount has been polymerized, a branching monomer such as chloromethylstyrene is introduced and reacted with the intermediate. Then the polymerizable monomer such as 4-tert-butoxystyrene and/or the branching monomer such as chloromethylstyrene is added again for polymerization. This operation is repeated many times until a desired dendritic or hyperbranched polymer is obtained. If necessary, the protective groups used to enable living polymerization are deblocked, yielding a dendritic or hyperbranched polymer of phenol derivative.

Examples of the branching monomer are given below.

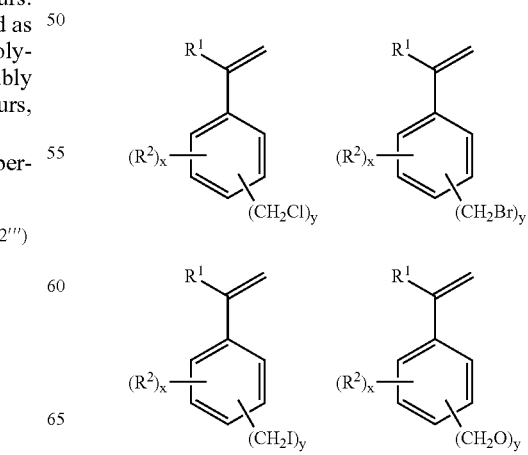

-continued

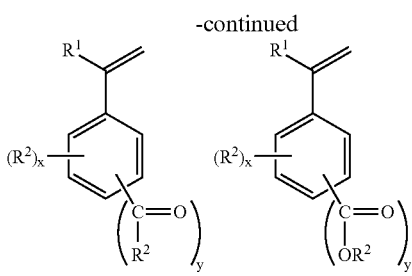

$R^1$, $R^2$, x and y are as defined above.

Illustrative examples of the dendritic or hyperbranched polymer are those having recurring units of the following approximate formulas (6) to (10).

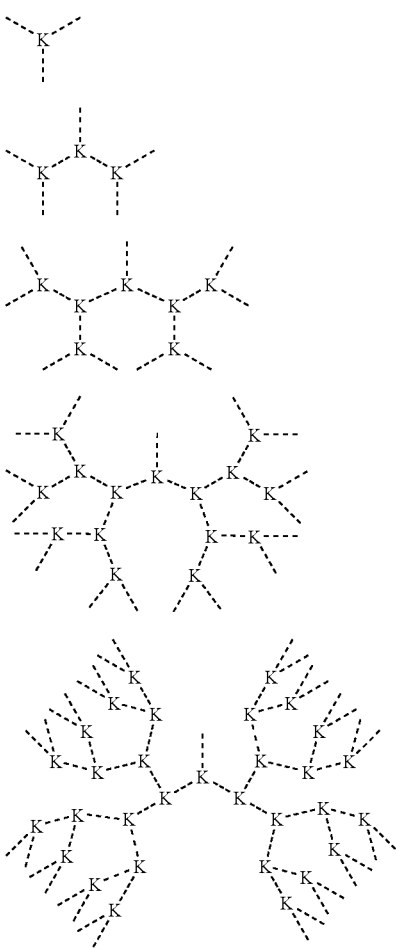

Herein, broken lines (---) represent polymer chains derived from the phenol derivative monomer, and K represents units derived from the branching monomer. The number of broken line segments between K and K is depicted merely for the sake of convenience, independent of the number of recurring units in the polymer chain included between K and K.

The dendritic or hyperbranched polymer of a phenol derivative is prepared by effecting living polymerization of the phenol derivative, reacting with a compound having a polymerizable moiety and a terminating moiety and proceeding further polymerization. By repeating this operation desired times, a dendritic or hyperbranched polymer of phenol derivative can be synthesized. The living polymerization may be effected by any desired technique although living anion polymerization is preferred because of ease of control. For the detail of synthesis, reference is made to JP-A 2000-344836.

The alkali-soluble resins or polymers should preferably have a weight average molecular weight (Mw) of 3,000 to 100,000, as measured by gel permeation chromatography (GPC) versus polystyrene standards. Many polymers with Mw of less than 3,000 do not perform well and are poor in heat resistance and film formation. Many polymers with Mw of more than 100,000 give rise to a problem with respect to dissolution in the resist solvent and developer because of their too large Mw. The polymer should also preferably have a dispersity (Mw/Mn) of up to 3.5, and more preferably up to 1.5. With a dispersity of more than 3.5, resolution is low in many cases. Although the preparation method is not critical, a poly(p-hydroxystyrene) or similar polymer with a low dispersity or narrow dispersion can be synthesized by living anion polymerization.

The preferred resins as component (A) are the foregoing alkali-soluble polymers in which some of the hydrogen atoms of the phenolic hydroxyl groups and/or some of the hydrogen atoms of the carboxyl groups are substituted, and more preferably polymers comprising recurring units of the formula (2a) or (2a') or (2a'').

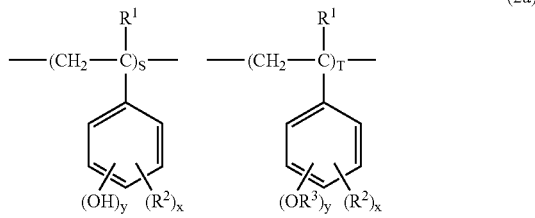

(2a)

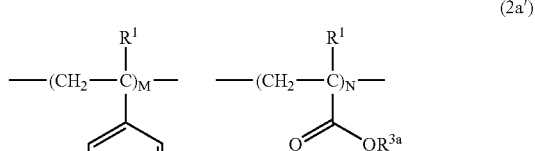

(2a')

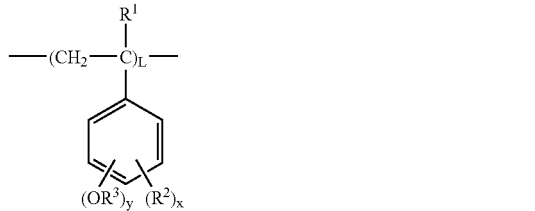

(2a'')

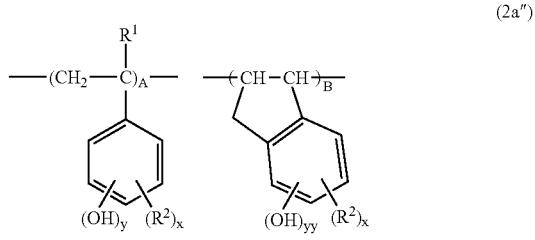

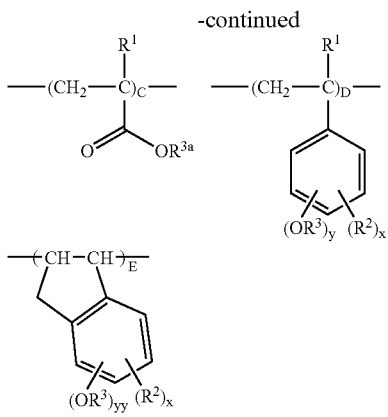

Herein, $R^3$ is an acid labile group, and $R^{3a}$ is hydrogen or an acid labile group, at least some of $R^{3a}$ being acid labile groups. All these acid labile groups are other than acetal type. $R^1$, $R^2$, x, y and yy are as defined above.

S and T are positive integers, satisfying $0<T/(S+T)\leq 0.8$, preferably $0.1\leq T/(S+T)\leq 0.5$, and more preferably $0.2\leq T/(S+T)\leq 0.4$ M and N are positive integers, L is 0 or a positive integer, satisfying $0<N/(M+N+L)\leq 0.5$ and $0<(N+L)/(M+N+L)\leq 0.8$; preferably $0.05\leq N/(M+N+L)\leq 0.5$, more preferably $0.1\leq N/(M+N+L)\leq 0.4$; preferably $0.1\leq L/(M+N+L)\leq 0.3$, more preferably $0.15\leq L/(M+N+L)\leq 0.2$; and preferably $0.1\leq (N+L)/(M+N+L)\leq 0.4$, more preferably $0.2\leq (N+L)/(M+N+L)\leq 0.3$.

A and B are positive integers, C, D and E each are 0 or a positive integer, satisfying $0<(B+E)/(A+B+C+D+E)\leq 0.5$ and $0<(C+D+E)/(A+B+C+D+E)\leq 0.8$. More preferably, A to E should satisfy the following range, expressed in terms of a proportion of each of A, B, C, D and E units based on the total (A+B+C+D+E).

| Unit | Preferred proportion | More preferred proportion |
| --- | --- | --- |
| A | 0.5-0.9 | 0.6-0.8 |
| B | 0.02-0.2 | 0.05-0.15 |
| C | 0-0.4 | 0.05-0.3 |
| D | 0-0.3 | 0.1-0.2 |
| E | 0-0.1 | 0.05-0.1 |
| B + E | 0.02-0.3 | 0.05-0.2 |
| C + D + E | 0.1-0.4 | 0.2-0.3 |

It is understood that the N and C units may be represented in divided form by the following formulae, respectively:

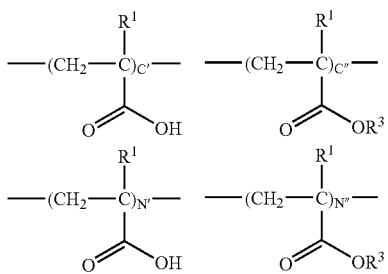

wherein $R^1$ and $R^3$ are as defined above, C'+C''=C and N'+N''=N. C'' is in the range: $0<C''/C\leq 1$, preferably $0.8\leq C''/C\leq 1$, more preferably $0.9\leq C''/C\leq 1$. N'' is in the range: $0<N''/N\leq 1$, preferably $0.8\leq N''/N\leq 1$, more preferably $0.9\leq N''/N\leq 1$.

The acid labile groups are selected from a variety of such groups as long as they are not of acetal type. In an embodiment relating to alkali-soluble polymers having phenolic hydroxyl groups or carboxyl groups wherein some or all of the phenolic hydroxyl groups or carboxyl groups are protected with acid-labile substituent groups having a C—O—C linkage, the preferred acid labile groups are groups of the following general formulae (3) to (5), tertiary alkyl groups of 4 to 20 carbon atoms, preferably 4 to 15 carbon atoms, trialkylsilyl groups whose alkyl groups each have 1 to 6 carbon atoms, oxoalkyl groups of 4 to 20 carbon atoms, or aryl-substituted alkyl groups of 7 to 20 carbon atoms.

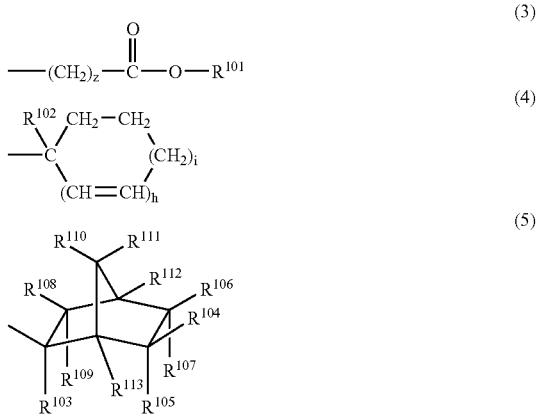

$R^{101}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl and 1-adamantyl-1-methylethyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter z is an integer of 0 to 6.

$R^{102}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h is equal to 0 or 1, i is equal to 0, 1, 2 or 3, satisfying 2h+i=2 or 3.

$R^{103}$ is a straight, branched or cyclic alkyl group of 1 to 8 carbon atoms or substituted or unsubstituted aryl group of 6 to 20 carbon atoms, examples of which are as exemplified for $R^{102}$. $R^{104}$ to $R^{113}$ are independently hydrogen or monovalent hydrocarbon groups of 1 to 15 carbon atoms which may contain a hetero atom or atoms, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted forms of these groups in which some hydrogen atoms are substituted with hydroxyl, alkoxy, carboxy, alkoxycarbonyl, oxo, amino, alkylamino, cyano, mercapto, alkylthio, and sulfo groups. Any two of $R^{104}$ to $R^{113}$, for example, a pair of $R^{104}$ and $R^{105}$, a pair of $R^{104}$ and $R^{106}$, a pair of $R^{105}$ and $R^{107}$, a pair of $R^{106}$ and $R^{107}$, a pair of $R^{108}$ and $R^{109}$, or a pair of $R^{110}$ and $R^{111}$, taken together, may form a ring. When any two of $R^{104}$ to $R^{113}$ form a ring, each is a divalent hydrocarbon group of 1 to 15 carbon atoms which may contain a hetero atom(s), examples of which are the above-exemplified monovalent hydrocarbon groups with one hydrogen atom eliminated. Also, two of $R^{104}$ to $R^{113}$ which are attached to adjacent carbon atoms (for example, a pair of $R^{104}$ and $R^{106}$, a pair of $R^{106}$ and $R^{112}$, or a pair of $R^{110}$ and $R^{112}$) may directly bond together to form a double bond.

Illustrative examples of the acid labile groups of formula (3) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile groups of formula (4) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, 3-ethyl-1-cyclohexen-3-yl, and 1-cyclohexyl-cyclopentyl.

Illustrative examples of the acid labile groups of formula (5) are given below.

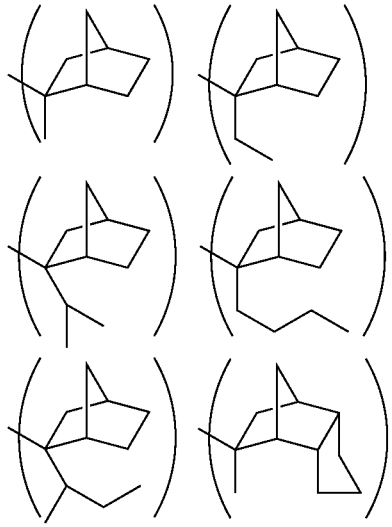

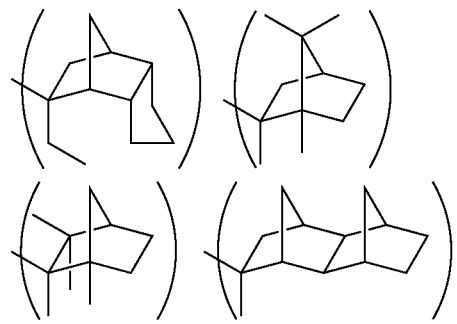

Exemplary of the tertiary alkyl group of 4 to 20 carbon atoms, preferably 4 to 15 carbon atoms, are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 1-adamantyl-1-methylethyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

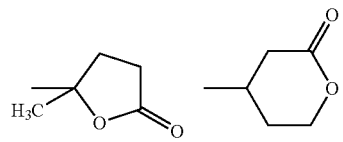

Exemplary of the aryl-substituted alkyl groups of 7 to 20 carbon atoms are benzyl, methylbenzyl, dimethylbenzyl, diphenylmethyl, and 1,1-diphenylethyl.

In the chemically amplified positive resist compositions of the invention, the resin used as component (A) is as described above while the preferred acid labile groups to substitute for phenolic hydroxyl groups are tert-butyl, tert-amyl, 1-ethylcyclohexyloxycarbonylmethyl, tert-butoxycarbonyl and tert-butoxycarbonylmethyl groups. Also, the hydrogen atoms of carboxyl groups of methacrylic or acrylic acid are desirably protected with substituent groups as typified by tert-butyl, tert-amyl, 2-methyl-2-adamantyl, 2-ethyl-2-adamantyl, 1-ethylcyclopentyl, 1-ethylcyclohexyl, 1-cyclohexylcyclopentyl and 1-ethylnorbornyl.

Within the same resin, these substituent groups may be of one type or two or more types. A blend of resins having substituent groups of different type is also acceptable.

The percent proportion of these substituent groups substituting for phenol and carboxyl groups in the resin is not critical. Preferably the percent substitution is selected such that when a resist composition comprising the resin is applied onto a substrate to form a coating, the unexposed area of the coating may have a dissolution rate of 0.01 to 10 Å/sec in a 2.38% tetramethylammonium hydroxide (TMAH) developer.

On use of a resin containing a greater proportion of carboxyl groups which can reduce the alkali dissolution rate, the percent substitution must be increased or non-acid-decomposable substituent groups to be described later must be introduced.

Resins having such acid labile groups introduced therein should preferably have a weight average molecular weight (Mw) of 3,000 to 100,000. With a Mw of less than 3,000, resins would perform poorly and often lack heat resistance and film formability. Resins with a Mw of more than 100,000 would be less soluble in a developer and a resist solvent because of their too high Mw.

The resin should preferably have a dispersity (Mw/Mn) of up to 3.5, preferably up to 1.5. Resins with too high a dispersity are often poor in dissolution, coating, storage stability and resolution.

To impart a certain function, suitable substituent groups may be introduced into some of the phenolic hydroxyl and carboxyl groups on the acid labile group-protected resin (A). Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxolanyl, 4-methyl-2-oxo-4-oxanyl, methyl, ethyl, propyl, n-butyl, sec-butyl, acetyl, pivaloyl, adamantyl, isoboronyl, and cyclohexyl.

In the resist composition of the invention, the above-described resin may be used alone or in admixture of two or more resins. The resin is added in any desired amount, and usually 65 to 99 parts by weight, preferably 65 to 98 parts by weight per 100 parts by weight of the solids in the composition. The term "solids" is used to encompass all components in the resist composition excluding the solvent.

Component B

Component (B) or photoacid generator used in the resist composition of the invention is a combination of a sulfonium salt of the following formula (1a) and a sulfonium salt of the following formula (1b), that is, 4-(tert-butoxyphenyl) diphenylsulfonium 2,4,6-triisopropylbenzenesulfonate and 4-(tert-butoxyphenyl)diphenylsulfonium nonafluoro-1-butanesulfonate.

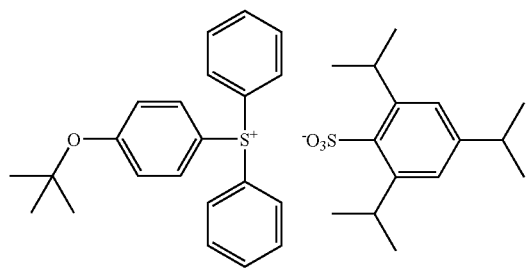

(1a)

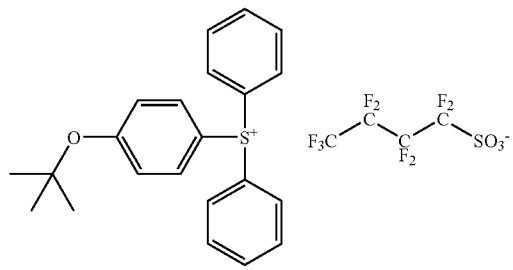

(1b)

In the chemically amplified positive resist composition, an appropriate amount of the photoacid generator (B) added is from 0.1 part to 10 parts by weight, and preferably from 1 to 5 parts by weight, per 100 parts by weight of the solids. A less amount of the photoacid generator below the range fails to generate a sufficient amount of acid to deblock acid labile groups in the polymer. Too large amounts may excessively reduce the transmittance of resist film, failing to form a rectangular pattern, and give rise to problems of abnormal particles and deposits during resist storage. The photoacid generators may be used alone or in admixture of two or more.

Beside the foregoing components, the chemically amplified positive resist composition of the invention may further include one or more of (C) a photoacid generator capable of generating an acid upon exposure to radiation other than component (B), (D) a basic compound, and (E) an organic acid derivative. On use, all these components are dissolved in (F) a solvent.

Component C

In one preferred embodiment, the resist composition further contains (C) a compound capable of generating an acid upon exposure to high-energy radiation (UV, deep UV, electron beam, x-rays, excimer laser beams, gamma-rays or synchrotron radiation), that is, an auxiliary photoacid generator other than component (B). Suitable auxiliary photoacid generators include sulfonium salts, iodonium salts, sulfonyldiazomethane and N-sulfonyloxydicarboxyimide photoacid generators. Exemplary auxiliary photoacid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl) diphenylsulfonium, bis(3-tert-butoxyphenyl) phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl) sulfonium, (4-tert-butoxycarbonylmethyloxyphenyl) diphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxydicarboxyimide photoacid generators include combinations of imide skeletons with sulfonates. Exemplary imide skeletons are succinimide, naphthalenedicarboxyimide, phthalimide, cyclohexyldicarboxyimide, 5-norbornene-2,3-dicarboxyimide, and 7-oxabicyclo[2.2.1]-5-heptene-2,3-dicarboxyimide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate or the like.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Also useful are compounds as described in U.S. Pat. No. 6,004,724, U.S. Pat. No. 6,261,738, JP-A 9-95479, JP-A 9-208554, JP-A 9-230588, JP 2906999 B2, JP-A 9-301948, JP-A 2000-314956, JP-A 2001-233842, and WO 2004-074242.

Of these, preferred photoacid generators are sulfonium salts, bissulfonyldiazomethanes, and N-sulfonyloxydicarboxyimides. Illustrative preferred photoacid generators include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-tert-butylphenylsulfonyl)diazomethane, N-camphorsulfonyloxy-5-norbornene-2,3-carboxylic acid imide, and N-p-toluenesulfonyloxy-5-norbornene-2,3-carboxylic acid imide.

In the resist composition comprising the sulfonium salts of formulae (1a) and (1b) as the first photoacid generator (B) according to the invention, the auxiliary photoacid generator (C) may be used in any desired amount as long as it does not compromise the effects of the invention. An appropriate amount of the auxiliary photoacid generator (C) is 0 to 2 parts, and especially 0 to 0.5 parts by weight per 100 parts by weight of the solids in the composition. Too high a proportion of the auxiliary photoacid generator (C) may give rise to problems of degraded resolution and foreign matter upon development and resist film peeling. The auxiliary photoacid generators may be used alone or in admixture of two or more. The transmittance of the resist film can be controlled by using an (auxiliary) photoacid generator having a low transmittance at the exposure wavelength and adjusting the amount of the photoacid generator added.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996).

Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition of the invention, an appropriate amount of the acid amplifier compound is up to 2 parts, and especially up to 1 part by weight per 100 parts by weight of the solids. Excessive amounts of the acid amplifier compound makes diffusion control difficult, leading to degradation of resolution and pattern profile.

Component D

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds with sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (D1) may also be included alone or in admixture.

$$N(X')_w(Y)_{3-w} \tag{D1}$$

In the formula, w is equal to 1, 2 or 3; Y is independently hydrogen or a straight, branched or cyclic alkyl group of 1 to 20 carbon atoms which may contain a hydroxyl group or ether structure; and X' is independently selected from groups of the following general formulas (X'1) to (X'3), and two or three X' may bond together to form a ring.

(X'1)

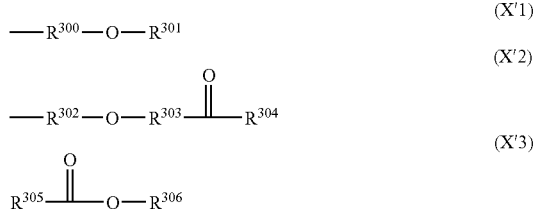
(X'2)

(X'3)

In the formulas, $R^{300}$, $R^{302}$ and $R^{305}$ are independently straight or branched alkylene groups of 1 to 4 carbon atoms; $R^{301}$, $R^{304}$ and $R^{306}$ are independently hydrogen, or straight, branched or cyclic alkyl groups of 1 to 20 carbon atoms, which may contain at least one hydroxyl group, ether structure, ester structure or lactone ring; and $R^{303}$ is a single bond or a straight or branched alkylene group of 1 to 4 carbon atoms.

Illustrative examples of the basic compounds of formula (D1) include tris(2-methoxymethoxyethyl)amine, tris{2-(2-methoxyethoxy)ethyl}amine, tris(2-(2-methoxyethoxymethoxy)ethyl)amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis [2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis (methoxycarbonylmethyl)amine, N-hexyl-bis (methoxycarbonylmethyl)amine, and β-(diethylamino)-δ-valerolactone.

Also useful are one or more of cyclic structure-bearing basic compounds having the following general formula (D2).

(D2)

Herein X' is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (D2) include 1-[2-(methoxymethoxy)ethyl]pyrrolidine, 1-[2-(methoxymethoxy) ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (D3) to (D6) may be blended.

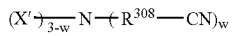  (D3)

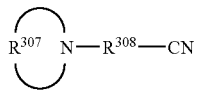  (D4)

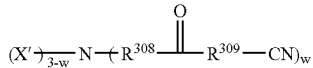  (D5)

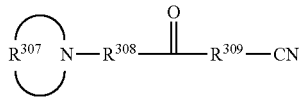  (D6)

Herein, X', $R^{307}$ and w are as defined above, and $R^{308}$ and $R^{309}$ each are independently a straight or branched alkylene group of 1 to 4 carbon atoms.

Illustrative examples of the cyano-bearing basic compounds having formulae (D3) to (D6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are basic compounds as described in JP-A 2004-347736 and JP-A 2004-347738.

The basic compounds may be used alone or in admixture of two or more. The basic compound is preferably formulated in an amount of 0 to 2 parts, and especially 0.01 to 1 part by weight, per 100 parts by weight of the solids in the resist composition. The use of more than 2 parts of the basis compound would result in too low a sensitivity.

Component E

Illustrative, non-limiting, examples of the organic acid derivatives (E) include phenol, cresol, catechol, resorcinol, pyrogallol, fluoroglycin, bis(4-hydroxyphenyl)methane, 2,2-bis(4'-hydroxyphenyl)propane, bis(4-hydroxyphenyl)sulfone, 1,1,1-tris(4'-hydroxyphenyl)ethane, 1,1,2-tris(4'-hydroxyphenyl)ethane, hydroxybenzophenone, 4-hydroxyphenylacetic acid, 3-hydroxyphenylacetic acid, 2-hydroxyphenylacetic acid, 3-(4-hydroxyphenyl)propionic acid, 3-(2-hydroxyphenyl)propionic acid, 2,5-dihydroxyphenylacetic acid, 3,4-dihydroxyphenylacetic acid, 1,2-phenylenediacetic acid, 1,3-phenylenediacetic acid, 1,4-phenylenediacetic acid, 1,2-phenylenedioxydiacetic acid, 1,4-phenylenedipropanoic acid, benzoic acid, salicylic acid, 4,4-bis(4'-hydroxyphenyl)valeric acid, 4-tert-butoxyphenylacetic acid, 4-(4-hydroxyphenyl)butyric acid, 3,4-dihydroxymandelic acid, and 4-hydroxymandelic acid. Of these, salicylic acid and 4,4-bis(4'-hydroxyphenyl)valeric acid are preferred. They may be used alone or in admixture of two or more.

In the chemically amplified positive resist composition of the invention, the organic acid derivative is preferably formulated in an amount of up to 5 parts, and especially up to 1 part by weight, per 100 parts by weight of the solids. The use of more than 5 parts of the organic acid derivative would result in too low a resolution. Depending on the combination of the other components in the resist composition, the organic acid derivative may be omitted.

Component F

Component (F) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methylpyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethyl sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent.

The solvent is preferably used in an amount of 300 to 2,000 parts by weight, especially 400 to 1,000 parts by weight per 100 parts by weight of the solids in the resist composition. The concentration of the resulting solution is not limited thereto as long as a film can be formed therefrom by existing methods.

In the chemically amplified positive resist composition of the invention, there may be added such additives as a surfactant for improving coating, and a light absorbing agent for reducing diffuse reflection from the substrate.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172, F173, R08 and R30 (Dai-Nippon Ink & Chemicals, Inc.), Fluorad FC430, FC431, FC4430 and FC4432 (Sumitomo 3M Co., Ltd.), Aashiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition of the invention, the surfactant is preferably formulated in an amount of up to 2 parts, and especially up to 1 part by weight, per 100 parts by weight of the solids.

In the chemically amplified positive resist composition of the invention, a UV absorber may be added. Those UV absorbers described in JP-A 11-190904 are useful, but the invention is not limited thereto. Exemplary UV absorbers are diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone; tert-butyl 9-anthracenecarboxylate, tert-amyl 9-anthracenecarboxylate, tert-methoxymethyl 9-anthracenecarboxylate, tert-ethoxyethyl 9-anthracenecarboxylate, 2-tert-tetrahydropyranyl 9-anthracenecarboxylate, and 2-tert-tetrahydrofuranyl 9-anthracenecarboxylate. The UV absorber may or may not be added to the resist composition depending on the type of resist composition. An appropriate amount of UV absorber, if added, is 0 to 5 parts, more preferably 0.1 to 4 parts, most preferably 0.5 to 2 parts by weight per 100 parts by weight of the solids in the resist composition.

For the microfabrication of integrated circuits, any well-known lithography may be used to form a resist pattern from the chemically amplified positive resist composition of the invention.

The composition is applied onto a substrate (e.g., Si, $SiO_2$, SiN, SiON, TiN, WSi, BPSG, SOG, organic anti-reflecting film, etc.) for microfabrication by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. Through a photomask having a desired pattern, the resist film is then exposed to radiation, preferably having an exposure wavelength of up to 300 nm, such as UV, deep-UV, electron beam, x-rays, excimer laser light, γ-rays and synchrotron radiation.

The preferred light source is a beam from an excimer laser, especially KrF excimer laser or deep UV of 245-255 nm wavelength. The exposure dose is preferably in the range of about 1 to 200 mJ/cm$^2$, more preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate. It is appreciated that the resist composition of the invention is best suited for micropatterning using such actinic radiation as deep UV with a wavelength of 254-193 nm, vacuum UV with a wavelength of 157 nm, electron beam, x-rays, excimer laser light, γ-rays and synchrotron radiation. With any of the above-described parameters outside the above-described range, the process may sometimes fail to produce the desired pattern.

EXAMPLE

Synthesis Examples, Examples and Comparative Examples are given below for further illustrating the invention although the invention is not limited thereto. It is noted that the weight average molecular weight (Mw) is as measured by gel permeation chromatography (GPC) versus polystyrene standards.

Synthesis Example 1

Synthesis of 2,4,6-triisopropylbenzenesulfonic acid

To 30.2 g (0.1 mol) of commercially available 2,4,6-triisopropylbenzenesulfonyl chloride were added 30 g of dimethyl sulfoxide and 30 g of water. Using an oil bath, the mixture was heated and stirred at 80° C. for 3 hours. The dimethyl sulfoxide-water solution was ready for use in the subsequent step of anion exchange reaction.

Synthesis Example 2

Synthesis of 4-(tert-butoxyphenyl)diphenylsulfonium 2,4,6-triisopropylbenzenesulfonate In 100 g of dichloromethane were dissolved 20.2 g (0.1 mol) of diphenyl sulfoxide and 32.6 g (0.3 mol) of trimethylsilyl chloride. To this reaction solution which was ice cooled, 1.0 g (0.01 mol) of triethylamine was added, and a tetrahydrofuran solution of 4-tert-butoxyphenyl magnesium chloride (0.3 mol) which had been prepared by a customary technique was then added dropwise at a temperature below 20° C. Thereafter, an aqueous solution of ammonium chloride was added at a temperature below 20° C., and 100 g of diethyl ether was further added.

To the aqueous layer separated, the dimethyl sulfoxide-water solution of 2,4,6-triisopropylbenzenesulfonic acid, prepared in Synthesis Example 1, and 300 g of dichloromethane were added, followed by stirring.

The organic layer was separated therefrom, washed three times with 200 g of water, and concentrated. To the concentrate, diethyl ether was added for recrystallization. The target compound was obtained as white crystals in a yield of 70%. It was analyzed by proton nuclear magnetic resonance ($^1$H-NMR) spectroscopy and infrared (IR) absorption spectroscopy, with the data shown below.

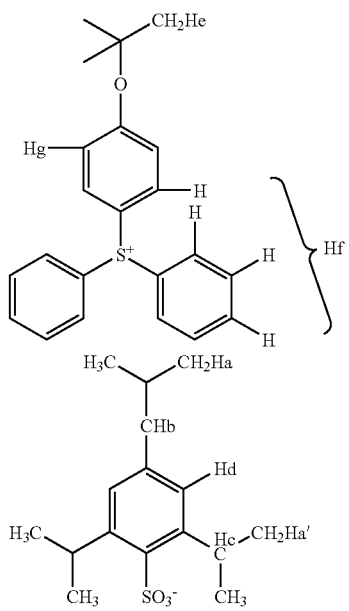

$^1$H-NMR (CDCl$_3$, σ ppm) 1.17-1.19 (12H, d, Ha'), 1.20-1.22 (6H, d, Ha), 1.43 (9H, s, He), 2.77-2.90 (1H, m, Hb), 4.69-4.83 (2H, m, Hc), 7.02 (2H, s, Hd), 7.15-7.18 (2H, d, Hg), 7.54-7.85 (12H, m, Hf)

IR (cm$^{-1}$) 3060, 2960, 2865, 1600, 1589, 1565, 1490, 1477, 1446, 1313, 1263, 1236, 1203, 1164, 1083, 1068, 1051, 1014, 906, 838, 750, 674, 588, 559, 543, 530, 501

Synthesis Example 3

Synthesis of 4-(tert-butoxyphenyl)diphenylsulfonium nonafluoro-1-butanesulfonate The procedure of Synthesis Example 2 was repeated except that potassium nonafluoro-1-butanesulfonate was used instead of the aqueous solution of 2,4,6-triisopropylbenzenesulfonic acid. The target compound was obtained as white crystals in a yield of 72%.

Examples 1-16 and Comparative Examples 1-5

Resist materials were prepared in accordance with the formulation shown in Table 1. The components used are shown below.

Polymer A: poly(p-hydroxystyrene) in which hydroxyl groups are protected with 15 mol % of 1-ethoxyethyl groups and 15 mol % of tert-butoxycarbonyl groups, having a weight average molecular weight of 12,000.

Polymer B: poly(p-hydroxystyrene) in which hydroxyl groups are protected with 25 mol % of 1-ethoxyethyl groups and which is crosslinked with 3 mol % of 1,2-propanediol divinyl ether, having a weight average molecular weight of 13,000.

Polymer C: poly(p-hydroxystyrene) in which hydroxyl groups are protected with 30 mol % of 1,1-dimethylpropyl groups, having a weight average molecular weight of 12,000.

Polymer D: poly(p-hydroxystyrene) in which hydroxyl groups are protected with 30 mol % of tert-butyl groups, having a weight average molecular weight of 12,000.

Polymer E: p-hydroxystyrene/2-ethyl-2-adamantyl acrylate copolymer having a compositional ratio (molar ratio) of 70:30 and a weight average molecular weight of 15,000.

Polymer F: p-hydroxystyrene/indene copolymer having a compositional ratio (molar ratio) of 80:20 in which hydroxyl groups of hydroxystyrene are protected with 20 mol % of tert-butoxycarbonyl groups, and having a weight average molecular weight of 10,000.

Polymer G: p-hydroxystyrene/indene/1-ethyl-1-norbornene methacrylate copolymer having a compositional ratio (molar ratio) of 80:5:15 and a weight average molecular weight of 8,000.

Polymer H: p-hydroxystyrene/indene/2-ethyl-2-adamantyl methacrylate copolymer having a compositional ratio (molar ratio) of 80:5:15 and a weight average molecular weight of 8,000.

PAG1: compound of Synthesis Example 2, i.e., 4-(tert-butoxyphenyl)diphenylsulfonium 2,4,6-triisopropylbenzenesulfonate PAG2: compound of Synthesis Example 3, i.e., 4-(tert-butoxyphenyl)diphenylsulfonium nonafluoro-1-butanesulfonate PAG3: triphenylsulfonium 2,4,6-triisopropylbenzenesulfonate PAG4: triphenylsulfonium nonafluoro-1-butanesulfonate PAG5: (4-tert-butylphenyl)diphenylsulfonium 2,4,6-triisopropylbenzenesulfonate PAG6: bis(cyclohexylsulfonyl)diazomethane PAG7: tris(4-methylphenyl)sulfonium nonafluoro-1-butanesulfonate Basic compound A: tri-n-butyl amine Basic compound B: tris(2-methoxyethyl)amine Organic acid derivative A: 4,4-bis(4'-hydroxyphenyl)valeric acid Organic acid derivative B: salicylic acid Surfactant A: FC-430 (Sumitomo 3M Co., Ltd.)

Surfactant B: Surflon S-381 (Asahi Glass Co., Ltd.)

Solvent A: propylene glycol methyl ether acetate

Solvent B: ethyl lactate

The resist materials thus obtained were each filtered through a 0.2-μm Teflon® filter, thereby giving resist solutions. These resist solutions were spin-coated onto 8-inch silicon wafers having an organic antireflection film (DUV-44, Brewer Science) of 610 Å thick coated thereon, so as to give a dry thickness of 0.4 μm. For the coating and subsequent baking and developing operations, a coater/developer Clean Track Act® 8 by Tokyo Electron Ltd. was used.

The coated silicon wafers were then baked on a hot plate at 110° C. for 90 seconds. The resist films were exposed to ⅔ annular illumination using an excimer laser stepper NSR-S203B (Nikon Corp., NA 0.68), then baked (PEB) at 110° C. for 90 seconds, and developed with a solution of 2.38% tetramethylammonium hydroxide (TMAH) in water, thereby giving positive patterns (Examples 1-16, Comparative Examples 1-5).

The resulting resist patterns were evaluated by the following tests.

Resist Pattern Evaluation

The optimum exposure dose (sensitivity Eop) was the exposure dose which provided a 1:1 resolution at the top and bottom of a 0.18-μm line-and-space pattern. The minimum line width (μm) of a line-and-space pattern which was ascertained separate at this dose was the resolution of a test resist. The shape in cross section of the resolved resist pattern was examined under a scanning electron microscope (SEM). The depth of focus (DOF) of the 0.18-μm line-and-space pattern was determined by offsetting the focal point and judging the resist to be satisfactory when the resist pattern shape was kept rectangular and the resist pattern film thickness was kept above 80% of that at accurate focusing.

The PED stability of a resist was evaluated by effecting post-exposure bake (PEB) after 24 hours of holding from exposure at the optimum dose of the 0.18-μm line-and-space pattern and determining a variation in 0.18-μm line width. The less the variation, the greater is the PED stability.

The extent of standing waves was determined by taking a photograph under SEM of a cross section of the resist processed at the dose that provided a 1:1 resolution at the top and bottom of a 0.14-μm line-and-space pattern (different from the optimum dose Eop for 0.18 μm L/S pattern) and visually observing the photograph. The resist was rated "good" when no standing waves were found and "poor" when standing waves were found.

The pattern profile was determined by visually observing the 0.14-μm line-and-space pattern of resist in cross section using above mentioned SEM photograph. The resist pattern was expressed "rectangular" when its profile was visually observed to be rectangular.

A variation (in-plane) during development was determined by measuring a variation in line width of a 0.14-μm line-and-space pattern. The resist is rated "good" when the variation in line width in the wafer plane is within 10% and "poor" when the variation is more than 10%.

Other Evaluation

The solubility of resist material in a solvent mixture was examined by visual observation and in terms of clogging upon filtration.

With respect to the coating property of a resist solution, uneven coating was visually observed. Additionally, using a film gage Lambda Ace VM-3010 (optical interference film gage by Dainippon Screen Mfg. Co., Ltd.), the thickness of a resist film on a common wafer was measured at different positions, based on which a variation from the desired coating thickness (0.6 μm) was calculated. The coating property was rated "good" when the variation was within 0.5% (that is, within 0.003 μm), "unacceptable" when the variation was from more than 0.5% to 1%, and "poor" when the variation was more than 1%.

Storage stability was judged in terms of foreign matter precipitation or sensitivity change with the passage of time. After the resist solution was aged for 100 days at the longest, the number of particles of 0.3 μm or larger per ml of the resist solution was counted by means of a particle counter KL-20A (R10n Co., Ltd.). Also, a change with time of sensitivity (Eop) from that immediately after preparation was determined. The storage stability was rated "good" when the number of particles is not more than 5 or when the sensitivity change was within 5%, and "poor" otherwise.

The results are shown in Table 2.

TABLE 1

| Composition (pbw) | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Polymer A | | | | | | | | | | | |
| Polymer B | | | | | | | | | | | |
| Polymer C | 80 | | | | | | | 15 | | | 15 |
| Polymer D | | 80 | | | | | 15 | | | 15 | |
| Polymer E | | | 80 | | | | | | | | |
| Polymer F | | | | 80 | | | | | 15 | 65 | |
| Polymer G | | | | | 80 | | | 65 | 65 | | 65 |
| Polymer H | | | | | | 80 | 65 | | | | |
| PAG1 | 3 | 3 | 5 | 3 | 3 | 3 | 5 | 3 | 3 | 5 | 4 |
| PAG2 | 4 | 3 | 3 | 3 | 5 | 3 | 5 | 4 | 5 | 4 | 4 |
| PAG3 | | | | | | | | | | | |
| PAG4 | | | | | | | | | | | 0.5 |
| PAG5 | | | | | | | | | | | |
| PAG6 | | | | | | | | | | | |
| PAG7 | | | | | | | 0.5 | | | 0.5 | |
| Basic compound A | | 0.3 | 0.3 | 0.3 | | 0.3 | 0.3 | 0.3 | 0.3 | | |
| Basic compound B | 0.3 | | | | 0.3 | | | | | 0.3 | 0.3 |
| Organic acid derivative A | 0.5 | | | | | | | | | | |
| Organic acid derivative B | | | | | | | | | | | |
| Surfactant A | 0.25 | 0.25 | | | | | 0.25 | 0.25 | 0.25 | | 0.25 |
| Surfactant B | | | 0.25 | 0.25 | 0.25 | 0.25 | | | | 0.25 | |
| Solvent A | 105 | 105 | 105 | 105 | 105 | 105 | 105 | 105 | 105 | 105 | 105 |
| Solvent B | 280 | 280 | 280 | 280 | 280 | 280 | 280 | 280 | 280 | 280 | 280 |

| Composition (pbw) | Example | | | | | Comparative Example | | | | |
|---|---|---|---|---|---|---|---|---|---|---|
| | 12 | 13 | 14 | 15 | 16 | 1 | 2 | 3 | 4 | 5 |
| Polymer A | | | | | | 80 | | | | 40 |
| Polymer B | | | | | | | 80 | | | |
| Polymer C | | 15 | | | | | | | | |
| Polymer D | 15 | | | 40 | | | | | | |
| Polymer E | | | 15 | | | | | | | |
| Polymer F | 65 | 65 | | | 40 | | | | 80 | |
| Polymer G | | | | 40 | | | | 80 | | 40 |
| Polymer H | | | 65 | | 40 | | | | | |
| PAG1 | 3 | 2 | 3 | 3 | 2 | 3 | 4 | | | |
| PAG2 | 2 | 2 | 3 | 5 | 2 | 3 | 3 | | | |
| PAG3 | | | | | | | | 3 | | |
| PAG4 | | | | | | | | 3 | 3 | |
| PAG5 | | | | 0.5 | | | | | 3 | 3 |
| PAG6 | 0.5 | | | | | 1 | | | | |
| PAG7 | | | | | | | | | | 3 |
| Basic compound A | | | | 0.3 | 0.3 | | 0.3 | | 0.125 | |
| Basic compound B | 0.3 | 0.3 | 0.3 | | | 0.3 | | | 0.125 | 0.125 |
| Organic acid derivative A | | 0.5 | | | | | | | 0.5 | |
| Organic acid derivative B | | | 0.25 | | | | | | | |
| Surfactant A | 0.25 | 0.25 | | | | 0.25 | 0.25 | 0.25 | 0.25 | |
| Surfactant B | | | 0.25 | 0.25 | 0.25 | | | | | 0.25 |
| Solvent A | 105 | 105 | 105 | 105 | 105 | 105 | 105 | 105 | 105 | 105 |
| Solvent B | 280 | 280 | 280 | 280 | 280 | 280 | 280 | 280 | 280 | 280 |

TABLE 2

| | | Sensitivity (mJ/cm$^2$) | Resolution (μm) | DOF at 0.18 μm (μm) | PED stability (nm) | Standing waves | 0.14-μm pattern profile | Development variation (in-plane variation) | Coating property | Storage stability |
|---|---|---|---|---|---|---|---|---|---|---|
| Example | 1 | 33 | 0.14 | 1.1 | −5 | good | rectangular | good | good | good |
| | 2 | 50 | 0.16 | 0.7 | 8 | good | rectangular | good | good | good |
| | 3 | 32 | 0.14 | 1.2 | 5 | good | rectangular | good | good | good |
| | 4 | 44 | 0.16 | 0.8 | 8 | good | rectangular | good | good | good |

TABLE 2-continued

|  |  | Sensitivity (mJ/cm²) | Resolution (μm) | DOF at 0.18 μm (μm) | PED stability (nm) | Standing waves | 0.14-μm pattern profile | Development variation (in-plane variation) | Coating property | Storage stability |
|---|---|---|---|---|---|---|---|---|---|---|
|  | 5 | 33 | 0.14 | 1.2 | 5 | good | rectangular | good | good | good |
|  | 6 | 36 | 0.14 | 1.2 | 5 | good | rectangular | good | good | good |
|  | 7 | 34 | 0.14 | 1.2 | 5 | good | rectangular | good | good | good |
|  | 8 | 34 | 0.14 | 1.2 | 5 | good | rectangular | good | good | good |
|  | 9 | 30 | 0.14 | 1.2 | 5 | good | rectangular | good | good | good |
|  | 10 | 35 | 0.16 | 0.8 | 8 | good | rectangular | good | good | good |
|  | 11 | 31 | 0.15 | 1.1 | 5 | good | rectangular | good | good | good |
|  | 12 | 42 | 0.15 | 0.8 | 5 | good | rectangular | good | good | good |
|  | 13 | 45 | 0.15 | 0.9 | 6 | good | rectangular | good | good | good |
|  | 14 | 35 | 0.14 | 1.2 | 5 | good | rectangular | good | good | good |
|  | 15 | 38 | 0.15 | 1.0 | 7 | good | rectangular | good | good | good |
|  | 16 | 38 | 0.15 | 1.1 | 6 | good | rectangular | good | good | good |
| Comparative Example | 1 | 30 | 0.15 | 0.7 | −10 | good | rounded top | poor | good | good |
|  | 2 | 36 | 0.15 | 0.8 | −8 | good | rounded top | poor | good | good |
|  | 3 | 35 | 0.15 | 1.0 | 5 | good | rounded top | poor | good | good |
|  | 4 | 43 | 0.16 | 0.8 | 7 | poor | rounded top | poor | good | good |
|  | 5 | 32 | 0.15 | 0.8 | −6 | poor | rounded top | poor | good | good |

Japanese Patent Application No. 2005-041587 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising
   (A) a resin containing acid labile groups other than acetal type which changes its solubility in an alkaline developer as a result of the acid labile groups being eliminated under the action of acid, and
   (B) sulfonium salts of the following formulae (1a) and (1b):

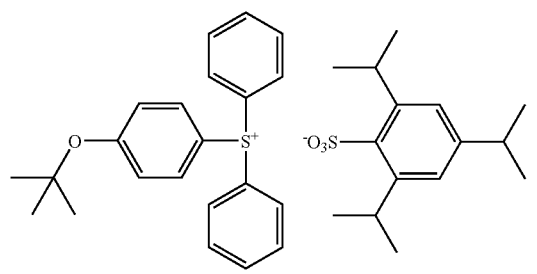

(1a)

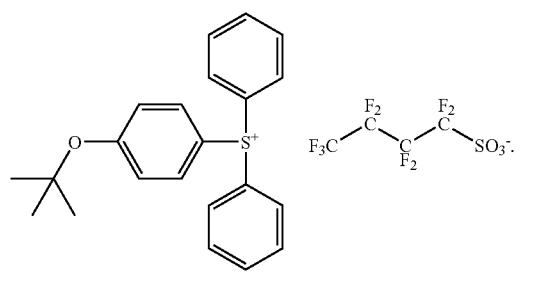

(1b)

2. The resist composition of claim 1 wherein the resin (A) is a polymer comprising recurring units having the general formula (2a), said recurring units including partially substituted units wherein some of hydrogen atoms of the phenolic hydroxyl groups are replaced by acid labile groups of at least one type, the acid labile group-containing units being included in a proportion of more than 0 mol % to 80 mol %, on the average, of the entire polymer, said polymer having a weight average molecular weight of 3,000 to 100,000,

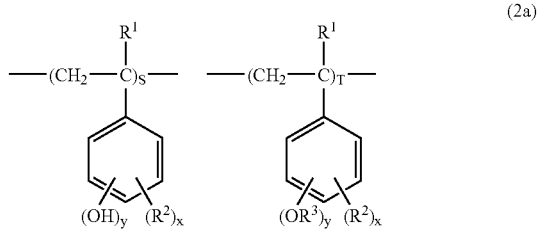

(2a)

wherein $R^1$ is hydrogen or methyl, $R^2$ is a straight, branched or cyclic alkyl group of 1 to 8 carbon atoms, x is 0 or a positive integer, y is a positive integer, satisfying $x+y \leq 5$, $R^3$ is an acid labile group other than acetal type, S and T are positive integers, satisfying $0 < T/(S+T) \leq 0.8$.

3. The resist composition of claim 1 wherein the resin (A) is a polymer comprising recurring units having the general formula (2a'), said recurring units including units derived from acrylate or methacrylate in a proportion of more than 0 mol % to 50 mol %, on the average, of the entire polymer and acid labile group-containing units in a proportion of more than 0 mol % to 80 mol %, on the average, of the entire polymer, said polymer having a weight average molecular weight of 3,000 to 100,000,

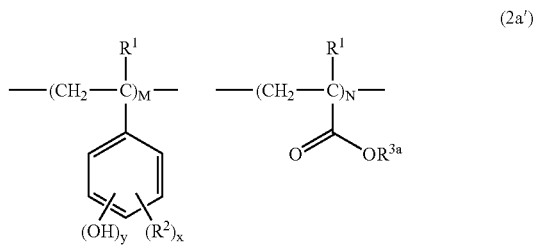

(2a')

-continued

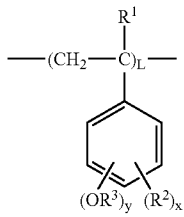

wherein $R^1$ is hydrogen or methyl, $R^2$ is a straight, branched or cyclic alkyl group of 1 to 8 carbon atoms, $R^3$ is an acid labile group other than acetal type, $R^{3a}$ is hydrogen or an acid labile group other than acetal type, at least some of $R^{3a}$ being acid labile groups other than acetal type, x is 0 or a positive integer, y is a positive integer, satisfying $x+y\leq 5$, M and N are positive integers, L is 0 or a positive integer, satisfying $0<N/(M+N+L)\leq 0.5$ and $0<(N+L)/(M+N+L)\leq 0.8$.

4. The resist composition of claim 1 wherein the resin (A) is a polymer comprising recurring units having the general formula (2a″), said recurring units including units derived from indene and/or substituted indene in a proportion of more than 0 mol % to 50 mol %, on the average, of the entire polymer and acid labile group-containing units in a proportion of more than 0 mol % to 80 mol %, on the average, of the entire polymer, said polymer having a weight average molecular weight of 3,000 to 100,000,

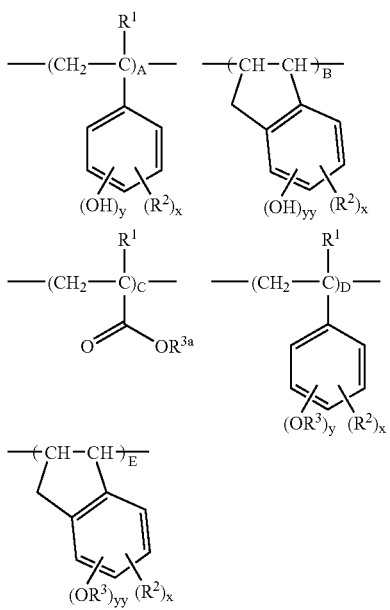

(2a″)

wherein $R^1$ is hydrogen or methyl, $R^2$ is a straight, branched or cyclic alkyl group of 1 to 8 carbon atoms, $R^3$ is an acid labile group other than acetal type, $R^{3a}$ is hydrogen or an acid labile group other than acetal type, at least some of $R^{3a}$ being acid labile groups other than acetal type, x is 0 or a positive integer, y is a positive integer, satisfying $x+y\leq 5$, yy is 0 or a positive integer, satisfying $x+yy\leq 4$, A and B are positive integers, C, D and E each are 0 or a positive integer, satisfying $0<(B+E)/(A+B+C+D+E)\leq 0.5$ and $0<(C+D+E)/(A+B+C+D+E)\leq 0.8$.

5. The resist composition of claim 2 wherein the acid labile group is selected from the group consisting of groups of the following general formulae (3) to (5), tertiary alkyl groups of 4 to 20 carbon atoms, trialkylsilyl groups whose alkyl groups each have 1 to 6 carbon atoms, oxoalkyl groups of 4 to 20 carbon atoms, and aryl-substituted alkyl groups of 7 to 20 carbon atoms,

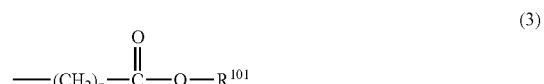

(3)

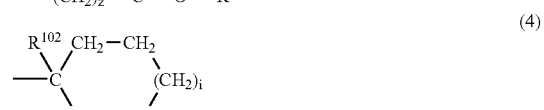

(4)

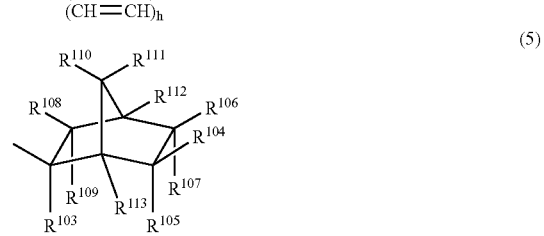

(5)

wherein $R^{101}$ is a tertiary alkyl group of 4 to 20 carbon atoms, trialkylsilyl group whose alkyl groups each have 1 to 6 carbon atoms, oxoalkyl group of 4 to 20 carbon atoms or a group of formula (4), z is an integer of 0 to 6, $R^{102}$ is a straight, branched or cyclic alkyl group of 1 to 8 carbon atoms or substituted or unsubstituted aryl group of 6 to 20 carbon atoms, h is 0 or 1, i is 0, 1, 2 or 3, satisfying $2h+i=2$ or 3, $R^{103}$ is a straight, branched or cyclic alkyl group of 1 to 8 carbon atoms or substituted or unsubstituted aryl group of 6 to 20 carbon atoms, $R^{104}$ to $R^{113}$ are each independently hydrogen or a monovalent hydrocarbon group of 1 to 15 carbon atoms which may contain a hetero atom, or $R^{104}$ to $R^{113}$, taken together, may form a ring, with the proviso that they are divalent hydrocarbon groups of 1 to 15 carbon atoms which may contain a hetero atom when they form a ring, or two of $R^{104}$ to $R^{113}$ which are attached to adjacent carbon atoms may directly bond together to form a double bond.

6. The resist composition of claim 1, further comprising (C) a compound capable of generating an acid upon exposure to radiation, other than component (B).

7. The resist composition of claim 1, further comprising (D) a basic compound.

8. The resist composition of claim 1, further comprising (E) an organic acid derivative.

9. The resist composition of claim 1, further comprising a propylene glycol alkyl ether acetate, an alkyl lactate or a mixture thereof as a solvent.

10. A process for forming a pattern, comprising the steps of:
(i) applying the resist composition of any one of claims 1 to 9 onto a substrate to form a coating,
(ii) heat treating the coating and exposing the coating to high energy radiation with a wavelength of up to 300 nm or electron beam through a photomask,
(iii) optionally heat treating the exposed coating, and developing the coating with a developer.

* * * * *